United States Patent
Koerzdoerfer et al.

(10) Patent No.: US 11,721,049 B2
(45) Date of Patent: Aug. 8, 2023

(54) METHOD FOR GENERATING AT LEAST ONE IMAGE DATASET AND ONE REFERENCE IMAGE DATASET, DATA CARRIER, COMPUTER PROGRAM PRODUCT, AND MAGNETIC RESONANCE SYSTEM

(71) Applicant: Siemens Healthcare GmbH, Erlangen (DE)

(72) Inventors: Gregor Koerzdoerfer, Erlangen (DE); Mathias Nittka, Baiersdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 422 days.

(21) Appl. No.: 17/101,480

(22) Filed: Nov. 23, 2020

(65) Prior Publication Data
US 2021/0166447 A1 Jun. 3, 2021

(30) Foreign Application Priority Data
Nov. 28, 2019 (EP) .................................... 19212159

(51) Int. Cl.
*G06T 11/00* (2006.01)
*G01R 33/48* (2006.01)
(Continued)

(52) U.S. Cl.
CPC .......... *G06T 11/008* (2013.01); *G01R 33/482* (2013.01); *G01R 33/4824* (2013.01);
(Continued)

(58) Field of Classification Search
CPC .... G06T 11/008; G06T 11/005; G06T 11/006; G01R 33/482; G01R 33/4824; G01R 33/5608; G01R 33/565; G06N 3/084
(Continued)

(56) References Cited

U.S. PATENT DOCUMENTS 7,888,935 B1 * 2/2011 Tan .................. G01R 33/56518
324/309
8,400,152 B2 * 3/2013 Lin .................... G01R 33/5611
324/309
(Continued)

FOREIGN PATENT DOCUMENTS

WO WO-2006120583 A2 * 11/2006 ........... G01R 33/561
WO WO-2016064990 A1 * 4/2016 ........... G01R 33/482
WO WO-2020142109 A1 * 7/2020 ............. A61B 5/055

OTHER PUBLICATIONS

Ma et al., "Magnetic resonance fingerprinting," Nature, vol. 495, No. 7440, pp. 187-192, XP055183037, ISSN 0028-0836, DOI: 10.1038/nature11971 (2013).
(Continued)

*Primary Examiner* — Mahendra R Patel
(74) *Attorney, Agent, or Firm* — Banner & Witcoff Ltd.

(57) ABSTRACT

In a method for generating an image dataset and one reference image dataset: a first raw dataset is provided that is recorded using a MR system, the first raw dataset including measurement signals at readout points in k-space that lie on a first k-space trajectory; a second raw dataset is provided that is recorded using the same MR system and on the same examination object, the second raw dataset including measurement signals at readout points in k-space that lie on a second, different k-space trajectory; image datasets are reconstructed from the first raw dataset, where a separate equalization coefficient set is used before the reconstruction of each image dataset; a reference image dataset is reconstructed from the second raw dataset; the reference image data set is compared with each image dataset to generate respective similarity values; and the image dataset is selected with a greatest similarity value.

16 Claims, 9 Drawing Sheets

Figure 1:
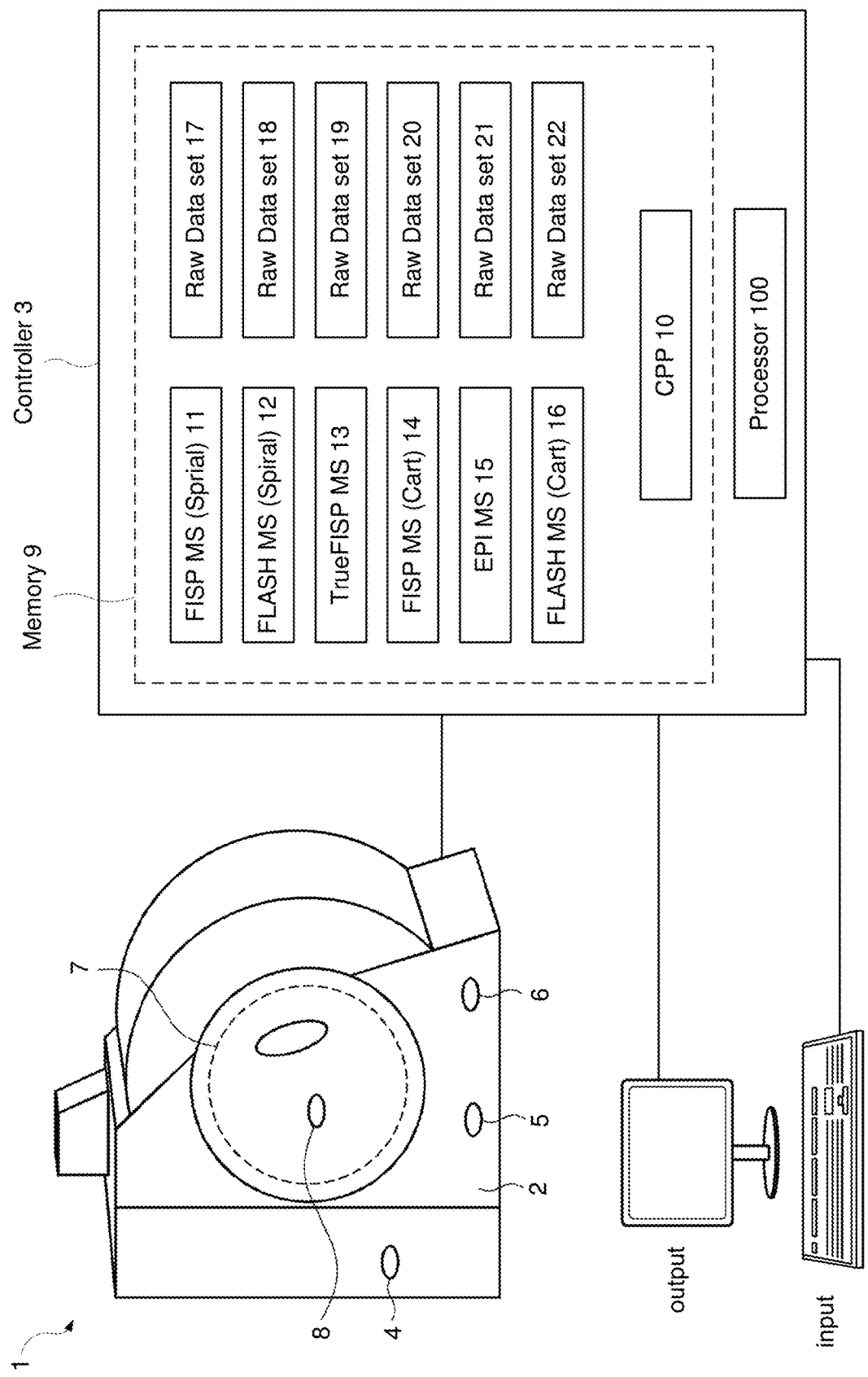

(51) Int. Cl.
G01R 33/56 (2006.01)
G06N 3/084 (2023.01)

(52) U.S. Cl.
CPC ......... *G01R 33/5608* (2013.01); *G06N 3/084* (2013.01); *G06T 11/005* (2013.01); *G06T 11/006* (2013.01)

(58) Field of Classification Search
USPC ........................................................ 382/131
See application file for complete search history.

(56) References Cited

U.S. PATENT DOCUMENTS

| | | | | |
|---|---|---|---|---|
| 8,483,463 | B2* | 7/2013 | Chen | G06T 11/006 382/131 |
| 2008/0169808 | A1* | 7/2008 | Taniguchi | G01R 33/5614 324/307 |
| 2012/0253175 | A1* | 10/2012 | Riederer | G01R 33/5635 600/420 |
| 2013/0281831 | A1* | 10/2013 | Riederer | G01R 33/5611 600/420 |
| 2014/0225612 | A1* | 8/2014 | Polimeni | G01R 33/4835 324/309 |
| 2014/0314293 | A1* | 10/2014 | Dagher | A61B 5/055 382/131 |
| 2019/0340463 | A1 | 11/2019 | Nittka et al. | |
| 2019/0383892 | A1* | 12/2019 | Nittka | G06T 7/0016 |
| 2020/0034998 | A1* | 1/2020 | Schlemper | G06F 17/18 |

OTHER PUBLICATIONS

Bucholz et. al., "Multi-spectral imaging with three-dimensional rosette trajectories," Magn. Reson. Med., vol. 59, No. 3, pp. 581-589, DOI:10.1002/mrm.21551 (2008).

Körzdörfer et al., "Magnetic resonance field fingerprinting," Magnetic Resonance in Medicine, vol. 15, pp. 1-13, XP055516998; ISSN: 0740-3194, DOI: 10.1002/mrm.27558 (2018).

European Search Report for German Application No. 19212159.8, dated Jul. 3, 2020.

European Search Report for German Application No. 19212159.8, dated Oct. 12, 2020.

\* cited by examiner

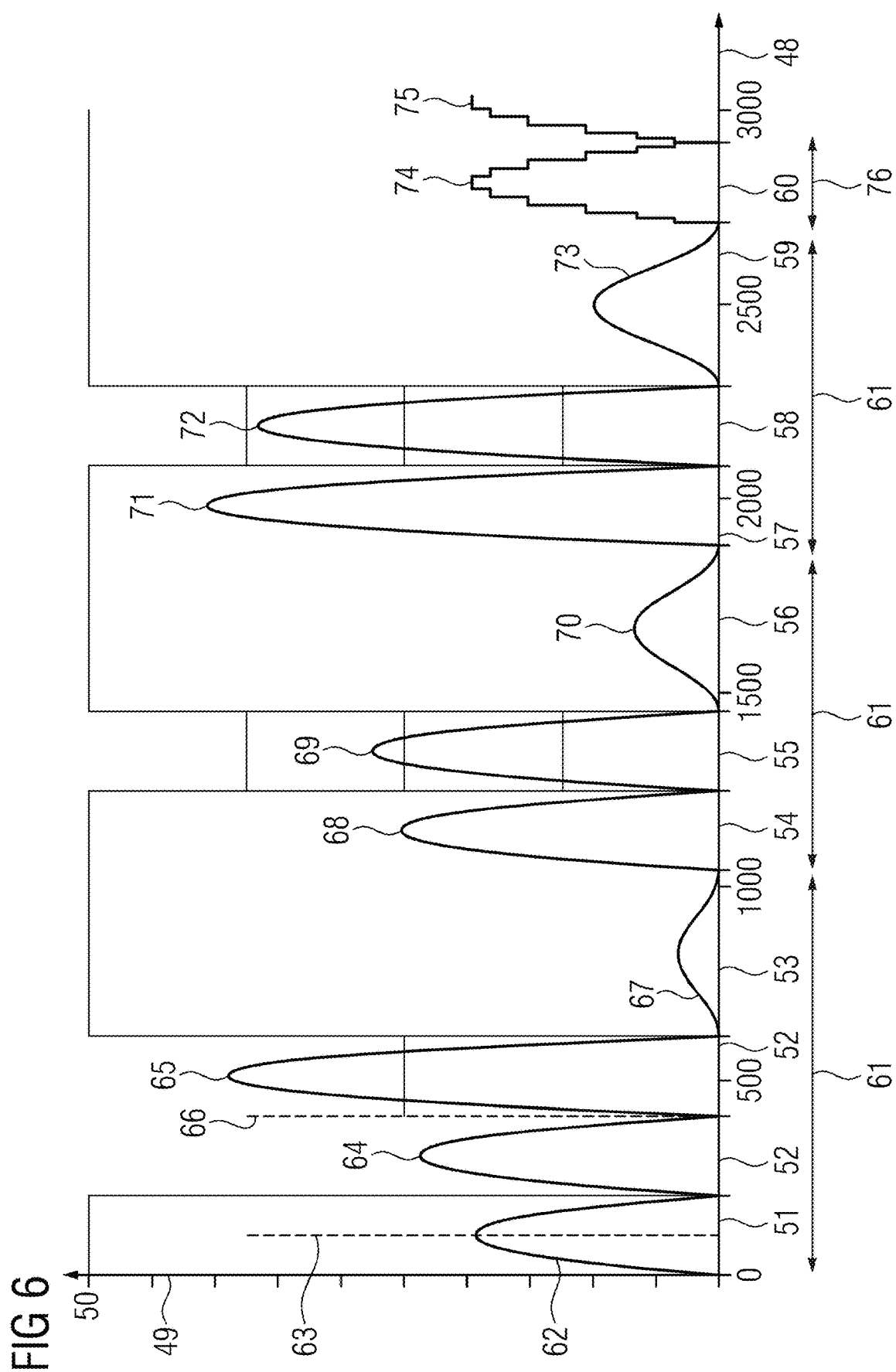

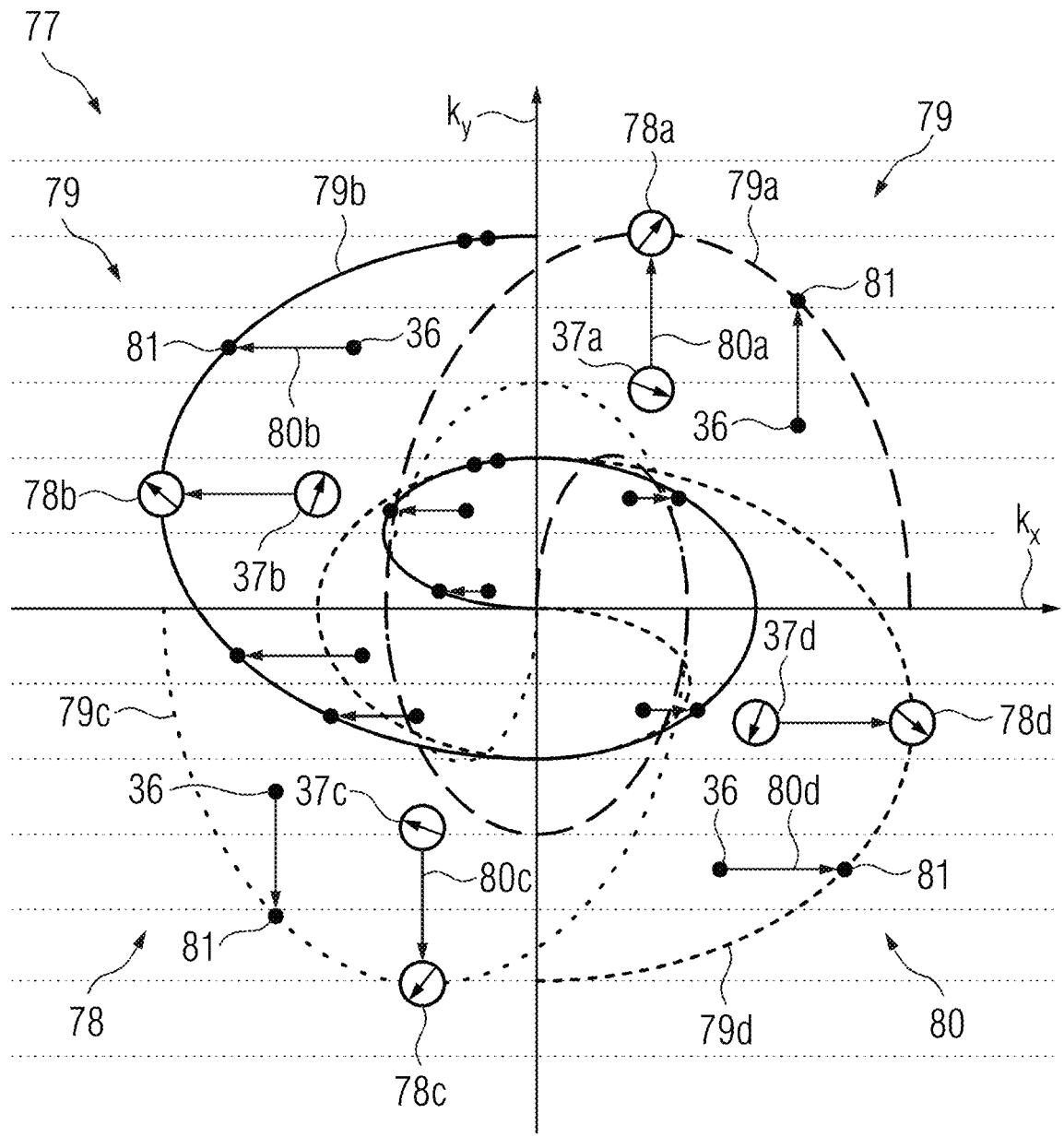

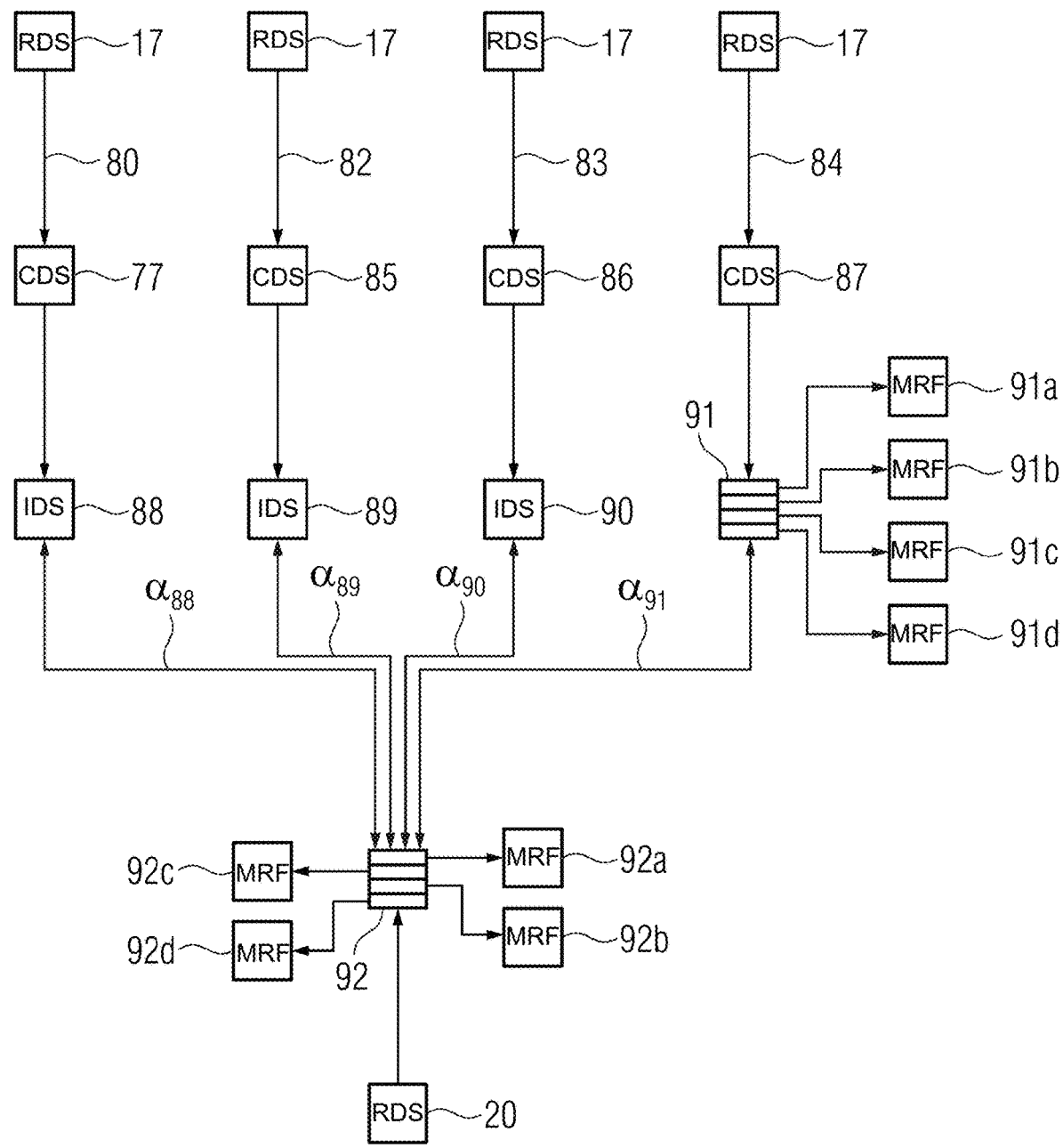

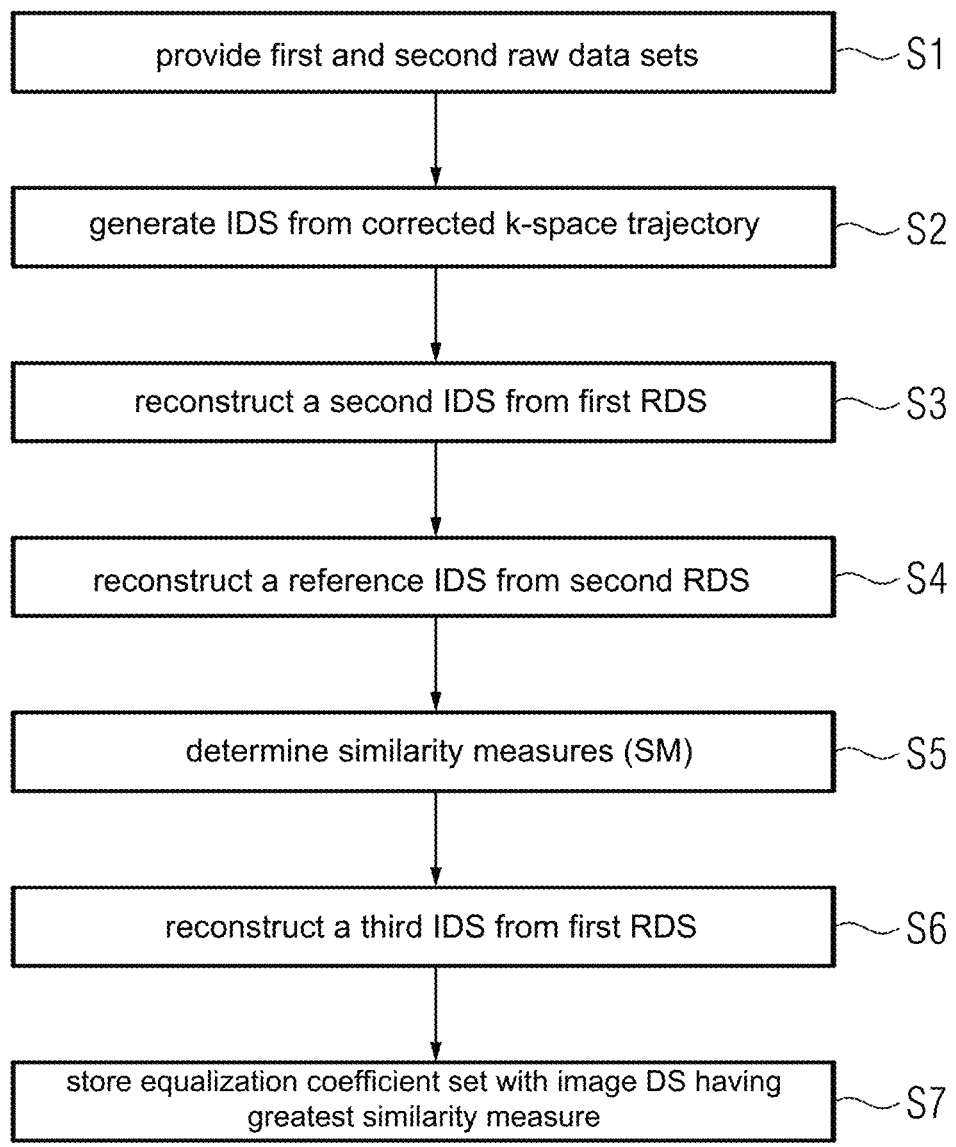

METHOD FOR GENERATING AT LEAST ONE IMAGE DATASET AND ONE REFERENCE IMAGE DATASET, DATA CARRIER, COMPUTER PROGRAM PRODUCT, AND MAGNETIC RESONANCE SYSTEM

CROSS REFERENCE TO RELATED APPLICATIONS

This patent application claims priority to European Patent Application No. 19212159.8, filed Nov. 28, 2019, which is incorporated herein by reference in its entirety.

BACKGROUND

Field

The disclosure relates to a method for generating at least one image dataset and one reference image dataset of an examination object from at least two raw datasets. The disclosure further relates to a computer program product, a data carrier, and a magnetic resonance system with which the aforementioned method can be carried out.

Related Art

In magnetic resonance imaging, measurement sequences are used to record raw datasets from which image datasets are processed. The so-called k-space (e.g. defined as the spatial frequency space of the spin density distribution) is scanned using a measurement sequence, wherein measurement signals are recorded in a spatially coded manner at a plurality of readout points.

Depending on the scanning scheme, reference is made for example to Cartesian, spiral or radial scanning of the k-space. The path with which the k-space is scanned is referred to as the k-space trajectory.

During Cartesian scanning, a constant reading gradient is usually present during the acquisition window, as a result of which an entire k-space row can be recorded. Depending on the measurement sequence, scanning takes place row by row in each case after radio-frequency excitation with intervening waiting times. In an Echo Planar Imaging (EPI) measurement sequence, on the other hand, after the excitation, a multiplicity of k-space rows is read out directly one after the other.

Even with radial scanning, there may be a waiting time between the recording of the individual spokes with a likewise constant reading gradient which can change the spatial direction from spoke to spoke, however, or a multi-echo recording can be carried out.

In the case of spiral trajectories, the scanning of at least part of the k-space takes place with a reading gradient which varies over time.

The scanning scheme is basically independent of the actual measurement sequence. A measurement sequence is a predetermined sequence of radio-frequency (RF) pulses, magnetic field gradients, acquisition windows and waiting times. Examples of such measurement sequences are a Gradient Echo (GE) measurement sequence, a Spin Echo (SE) measurement sequence, Fast Low Angle SHot (FLASH), a Fast Imaging with Steady Precession (FISP) measurement sequence, a True Fast Imaging with Steady Precession (TrueFISP) measurement sequence, a Turbo Spin Echo (TSE) measurement sequence, an Echo Planar Imaging (EPI) measurement sequence, and many more.

In particular, in the case of a FLASH, FISP or TrueFISP measurement sequence, any of the aforementioned scanning schemes can be used.

Magnetic field gradients are used for position encoding. Usually, a magnetic resonance system designed for imaging has three gradient coils for generating three gradient fields. These are perpendicular to one another in order to enable position encoding in all spatial directions.

By selectively applying gradients in a first and second image direction, for example a reading direction and a phase encoding direction, the readout points, i.e. the position of the measurement signals in the k-space, are determined.

These gradient fields are superimposed on a constant magnetic field B0. The constant magnetic field B0 often has a strength of 1.5 T in clinical applications. However, magnetic resonance systems with 0.5 T or up to 8 T are also known.

The constant magnetic field B0 should be constant in the region from which measurement signals are recorded. This region lies approximately in the middle of a magnetic resonance system and is also referred to as the homogeneous region of the constant magnetic field B0.

By introducing a sample, the homogeneity of the constant magnetic field $B_0$ is always disturbed. Therefore, it is known to carry out corrections in a patient-specific manner. This correction is also called "shimming" because so-called shim coils can be supplied with current in order to homogenize the constant magnetic field B0.

Despite these corrections, so-called local off-resonances may remain. A local off-resonance is a magnetic field strength different from the expected constant magnetic field B0, that is to say a deviation from the expected constant magnetic field B0.

Such deviations can lead to strong artifacts, in particular in the case of spiral k-space trajectories or measurement sequences with multi-gradient echo readout, such as in an EPI measurement sequence, as they change the phase of the measurement signal with increasing readout duration. This generally leads to the displacement of image data along the readout direction after transformation from the frequency space into the image space. In the case of spiral trajectories in which the readout direction varies, this leads to so-called blurring.

There is a multiplicity of off-resonance correction methods, in particular for spiral k-space trajectories. Either these are self-calibrated or an external $B_0$ map must be measured. On the basis of the $B_0$ information, the measurement signals can be manipulated in such a way that the smearing, referred to as blurring, no longer occurs. A frequency-segmented method is known, for example, in which a $B_0$ map is segmented according to n off-resonances. The measurement signals are reconstructed using various off-resonances, i.e. n images for n off-resonances are reconstructed. The segmented $B_0$ map is used to select which of the n images contains the correctly reconstructed pixel for each pixel.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 A magnetic resonance system according to an exemplary embodiment of the disclosure.

Figure 2:
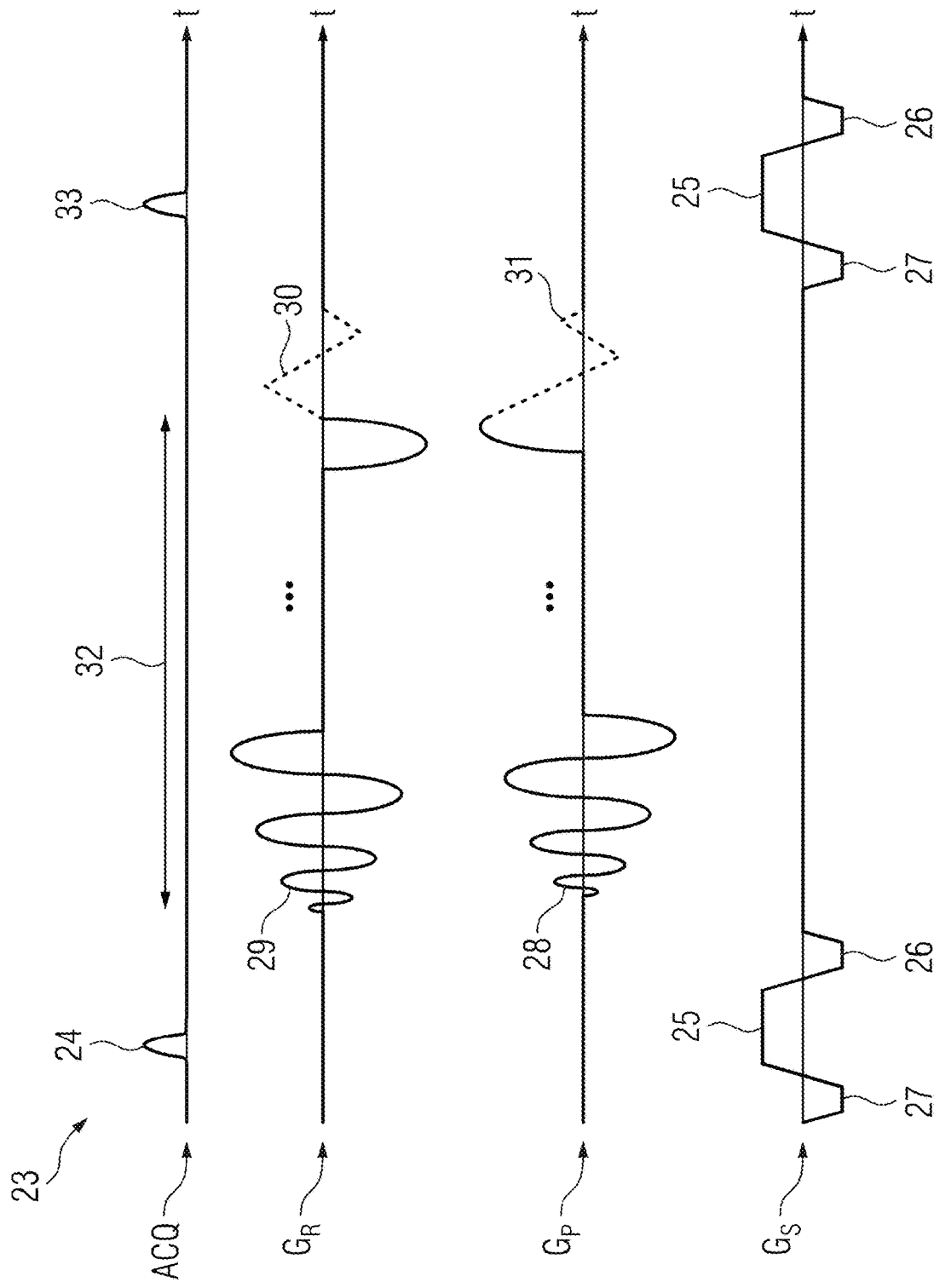

FIG. 2 A True Fast Imaging with Steady Precession (TrueFISP) sequence diagram according to an exemplary embodiment of the disclosure.

Figure 3:
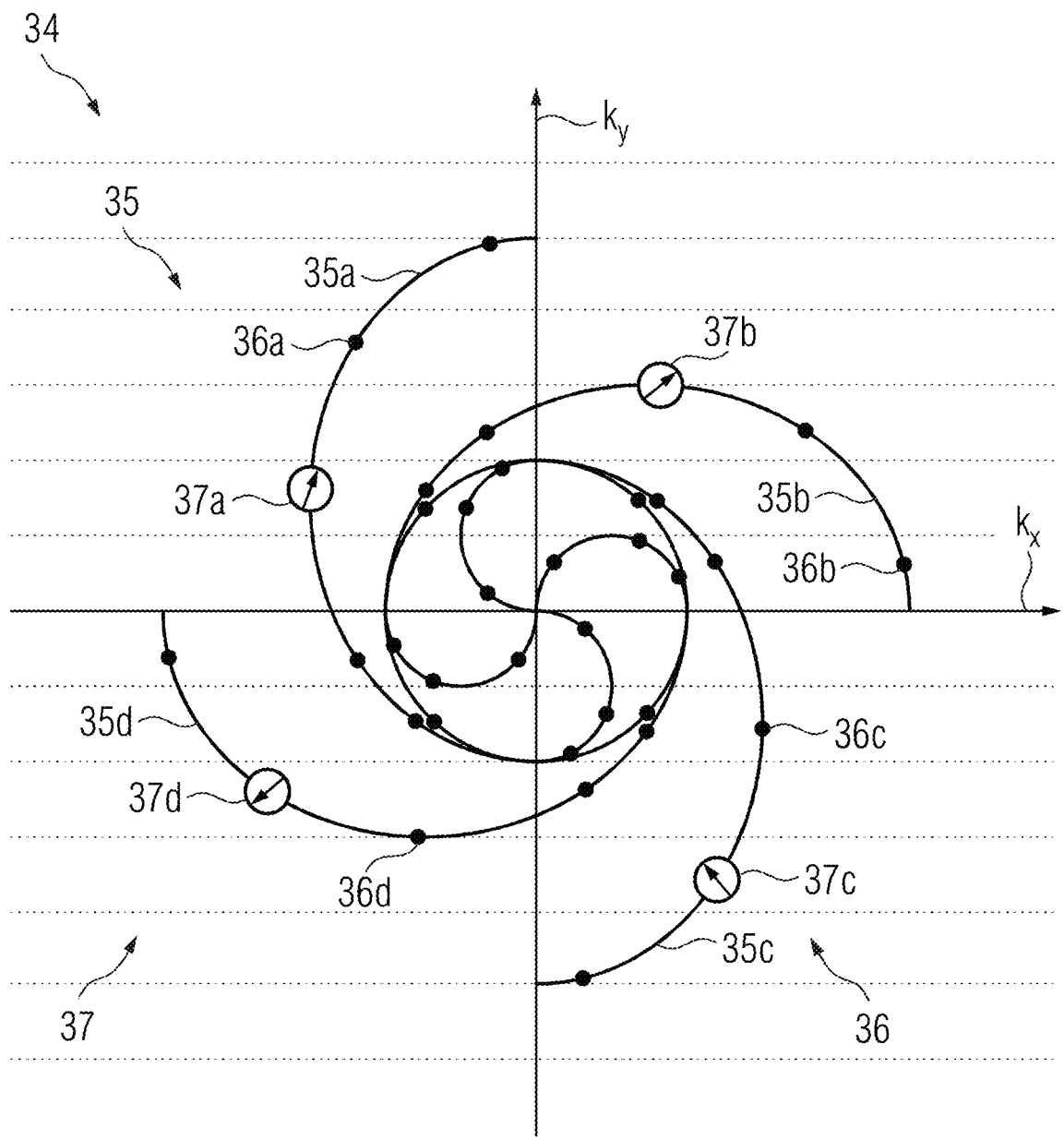

FIG. 3 A spiral k-space trajectory according to an exemplary embodiment of the disclosure.

Figure 4:
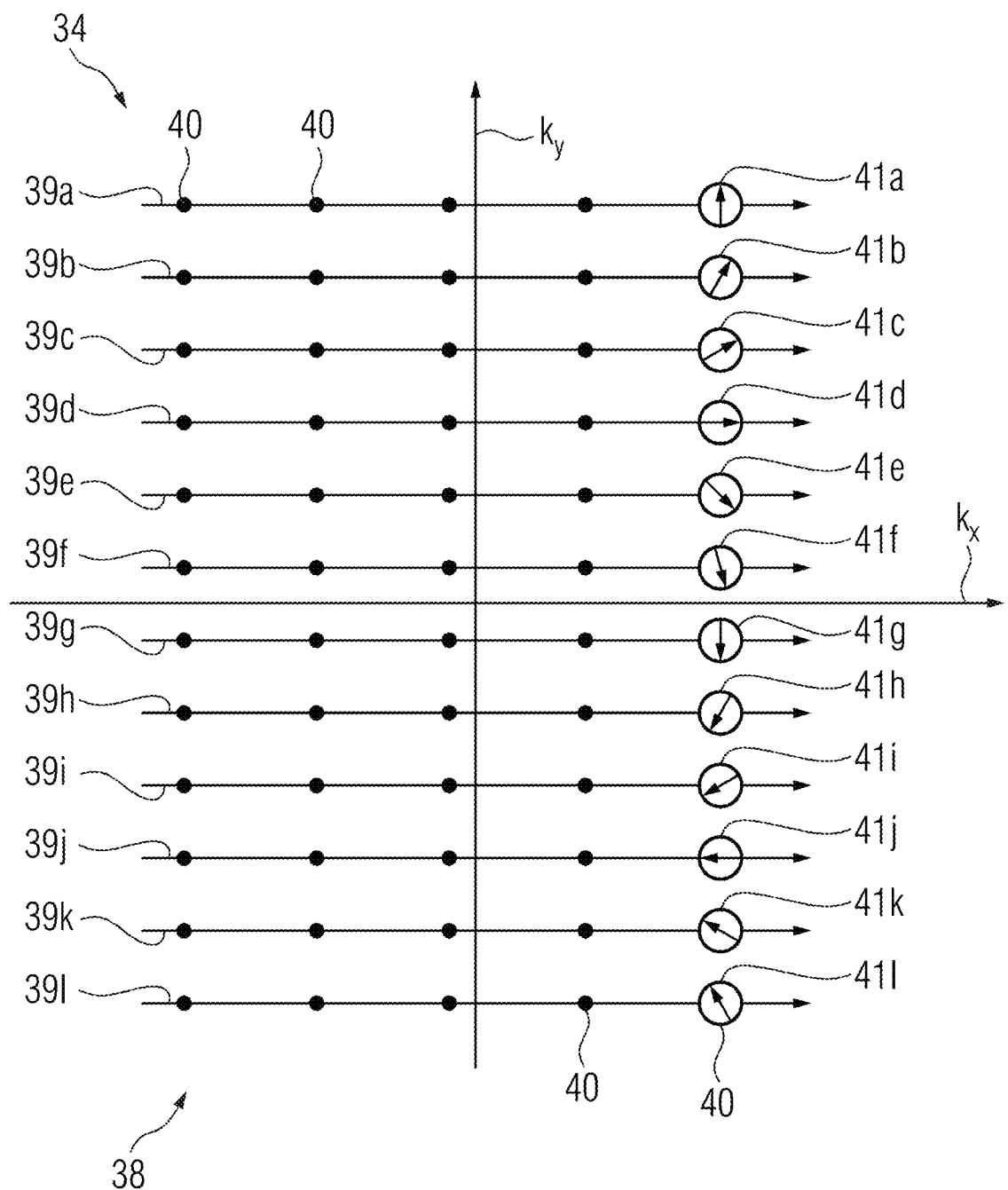

FIG. 4 A Cartesian k-space trajectory with unconnected k-space rows according to an exemplary embodiment of the disclosure.

Figure 5:
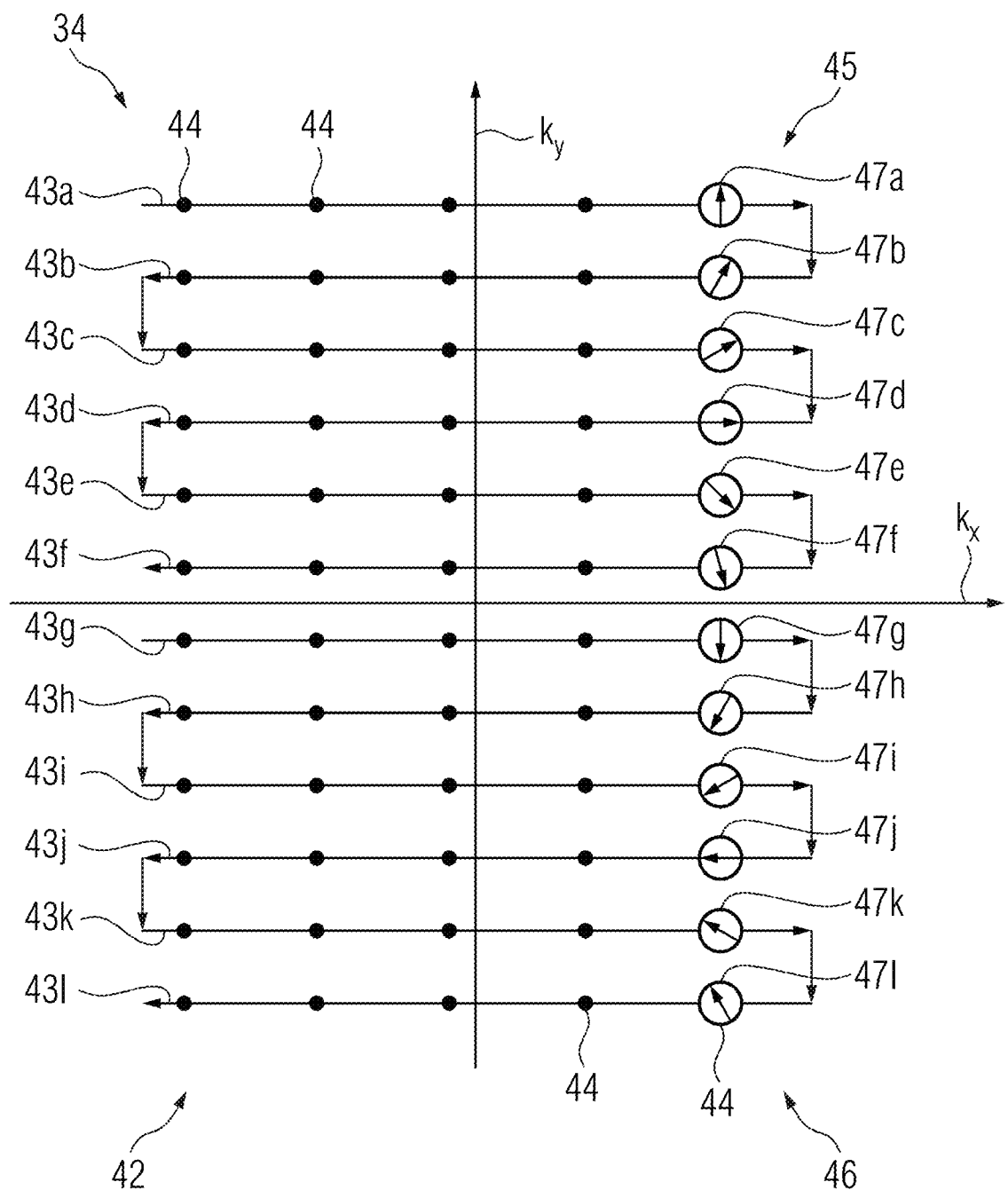

FIG. 5 A Cartesian k-space trajectory with connected k-space rows according to an exemplary embodiment of the disclosure.

FIG. 6 A Magnetic Resonance Fingerprinting (MRF) method with a plurality of measurement sequences according to an exemplary embodiment of the disclosure.

FIG. 7 A corrected first raw dataset according to an exemplary embodiment of the disclosure.

FIG. 8 A method for generating an image dataset according to an exemplary embodiment of the disclosure.

FIG. 9 A method for generating an image dataset according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure to implement a method for simple and robust off-resonance correction, in particular for spiral k-space trajectories.

This object is achieved by the methods for generating at least one image dataset and one reference image dataset of an examination object from at least two raw datasets, according to exemplary aspects. In an exemplary embodiment, the method includes:

Providing a first raw dataset, wherein the first raw dataset is recorded using a magnetic resonance system and comprises measurement signals at a plurality of readout points in the k-space, wherein the readout points lie on a first k-space trajectory, Providing a second raw dataset, wherein the second raw dataset is recorded using the same magnetic resonance system and on the same examination object as the first raw dataset and comprises measurement signals at a plurality of readout points in the k-space, wherein the readout points lie on a second k-space trajectory different from the first trajectory, Reconstructing a plurality of image datasets from the first raw dataset, wherein a separate equalization coefficient set is used before the reconstruction of each image dataset, wherein an equalization coefficient set defines a phase shift of the measurement signals of the first raw dataset in the k-space, Reconstructing a reference image dataset from the second raw dataset, Comparing the image dataset with the reference image dataset, wherein a similarity value is generated in each case during the comparison, and Selecting the image dataset with the greatest similarity value.

The k-space is known to be the scanned frequency space. It is a mathematical data space in which the measurement signals can be represented in the form of k-space points. The Nyquist criterion determines how many k-space points need to be scanned in order to obtain a reconstruction without convolutional artifacts. Such a k-space is also referred to as complete. Subscanning, on the other hand, leads to so-called convolutional artifacts. However, there are types of recording, such as parallel imaging, for example, in which image datasets free of convolutional artifacts can also be obtained from subscanned k-spaces using special reconstruction methods.

Several possibilities exist for scanning the k-space. Thus, even with Cartesian scanning, different scans can result from the sequence in which the k-space rows are recorded. The path in the k-space, which is defined by the gradient fields after the RF excitation or RF excitations, is the so-called k-space trajectory. This can be visualized in k-space representations. The k-space trajectory thus shows the path of the recording of all measurement signals which go into a raw dataset. A k-space trajectory can therefore also consist of partial trajectories.

The k-space points which were actually scanned are referred to as readout points. The measurement signals which have been recorded are stored in a raw dataset already mentioned.

A magnetic resonance system with a receiver coil arrangement and gradient coils is designed to acquire raw datasets with different measurement sequences. As a result, the image datasets reconstructed from a raw dataset can have different contrasts. Different scanning schemes can also be used when using the same measurement sequence, resulting in different k-space trajectories.

It has been found that some k-space trajectories are more sensitive to local off-resonances than others, such that they display deviations between the actual and desired phases sooner than others. Two raw datasets are therefore provided, which are recorded with different k-space trajectories. The k-space trajectory which is less sensitive to constant magnetic field deviations can be used to correct the more sensitive k-space trajectory.

This is done through targeted phase shifts. The displacement vectors of the individual readout points are combined in an equalization coefficient set. In an exemplary embodiment, with an equalization coefficient set, the first raw dataset is converted into a corrected first raw dataset and then reconstructed to form an image dataset through a Fourier transform. There is then a separate image dataset for each equalization coefficient set.

These image datasets, which have all been reconstructed from the first raw dataset using a different equalization coefficient set in each case, are then compared with a reference image dataset reconstructed from the second raw dataset. During the comparison, a similarity value is generated and the image dataset with the greatest similarity value continues to be used.

One of the equalization coefficient sets can also represent an identity mapping, that is to say not undertake any shift. Without constant magnetic field deviations, the image dataset reconstructed using this equalization coefficient set is the one with the greatest similarity value.

The similarity value is advantageously determined via an edge comparison. Then, when determining the similarity, above all the structure is taken into account, not the signal intensity distributions.

The method described can be used variously often:

Either it is sufficient to carry out the method once for each patient, which is the case when the off-resonances always lead to the same phase shifts in all the first raw datasets recorded of the patient in this session. Then the equalization coefficient set found for a first raw dataset can continue to be used for all other first raw datasets.

Otherwise, the best equalization is to be determined individually for each first raw dataset. A number of equalization coefficient sets must then be applied to each first raw dataset, an equal number of image datasets must be reconstructed, and the image dataset with the greatest similarity measure must be determined.

In an exemplary embodiment, a trajectory is used as the first k-space trajectory in which the scanning of at least part of the k-space takes place with a reading gradient that varies over time, in particular a spiral trajectory, i.e. a spiral k-space trajectory. Because of their relatively long readout time, spiral trajectories are sensitive to constant magnetic field deviations, as described above, as phase deviations accumulate, and the image data blurs in all directions. Accordingly, each readout point has a different phase shift. As also described above, a k-space trajectory denotes the entirety of all measurement signals that are used for the reconstruction of an image dataset. A spiral k-space trajectory can therefore have a spiral. However, it can also comprise at least two, i.e. a plurality of, spirals.

To generate spiral trajectories, measurement sequences equipped with two oscillating gradients are used.

Alternatively, a path with at least two connected k-space rows can be used as the first k-space trajectory. A k-space row can be a k-space row or a spoke. In an exemplary embodiment, two successive k-space rows each have a different, in particular an opposite, readout direction. Such a k-space trajectory is present, inter alia, in multi-gradient echo measurement sequences such as an EPI measurement sequence. Constant magnetic field deviations also accumulate in such measurement sequences. As k-space rows, the k-space rows are preferably at a distance in the phase encoding direction, that is to say are scanned in a Cartesian arrangement. Alternatively, the k-space rows can also be obtained as spokes in a radial scan.

The connection of the k-space rows thus arises by means of reading out a multi-gradient echo. The rows or spokes in a k-space representation are actually connected.

The k-space can be scanned in a single step, as a so-called "single-shot" scan, or in segments. The more k-space rows are recorded in one step, the greater the susceptibility with regard to constant magnetic field deviations.

Furthermore, other complicated trajectories are conceivable, such as rosette (http://www.ncbi.nlm.nih.gov/pmc/articles/PMC2746043/) or in principle trajectories in which, due to a relatively long read-out period, distortions occur due to phase accumulation.

Advantageously, a Cartesian distribution of the readout points can be used as a second k-space trajectory. This can preferably be recorded with a measurement sequence in which only a few or preferably a single gradient echo is recorded. The k-space trajectory then consists of individual, unconnected k-space rows or of blocks of few unconnected rows. Few gradient echoes means fewer gradient echoes than in the first raw dataset, in particular a maximum of 10 gradient echoes. Advantageously, a single gradient echo is acquired in one step.

The feature of few or a single gradient echo also includes all imaging spin echo and mixed measurement sequences. In the case of spin echo measurement sequences too, a gradient echo is generated at the same time as the spin echo by means of a read dephasing gradient and the following read gradients.

In an exemplary embodiment, only one of the first gradient echo signals or the first gradient echo signals are used to reconstruct the reference image dataset. If a turbo spin echo measurement sequence is combined with a 2-point Dixon method when recording the raw data, the second gradient echo in each case is used to generate a second image dataset. Such gradient echoes are, however, irrelevant to the reference image dataset, which is advantageously reconstructed from the respective first gradient echoes.

Alternatively, a path with unconnected spokes or few connected spokes can be used as the second k-space trajectory. Radial scanning with a single or few gradient echo signals is therefore also possible. Here too, the few gradient echo signals are fewer gradient echo signals than in the first raw dataset, preferably a maximum of 10 gradient echo signals.

A model of the constant magnetic field deviation during the recording of the first raw dataset can preferably be used in the generation of at least one equalization coefficient set. All causes for deviations which are known can be incorporated into the model. It is not necessary to know the exact deviations for this purpose, otherwise they could be taken into account in the reconstruction from the outset.

However, it can be taken into account whether the gradient moments tend to be too large or too small, whether the constant magnetic field deviation is stronger due to anticipated sudden changes in susceptibility. In the lung area, for example, larger local off-resonances are to be expected than with a limb. Specially adapted equalization coefficient sets can therefore be generated with regard to the identified deviations.

Furthermore, greater phase shifts can be provided in the center of the k-space than further outside, as the constant magnetic field deviations are greater in relation to the applied gradient strengths in the center. All prior knowledge about the position of air pockets, shim corrections and the gradients can be included in the equalization coefficient sets in order to achieve equalization with as few equalization coefficient sets as possible.

Alternatively, or additionally, at least one equalization coefficient set can be generated with random numbers. In a first embodiment, the phase shifts for each equalization coefficient set are only generated with random numbers. This is a kind of brute force approach. This procedure can always be used as it does not require any prior knowledge.

In a second alternative, the use of random numbers can be combined with the application of prior knowledge, for example the model of constant magnetic field deviation in the recording of the first raw dataset. In this case, model errors can be intercepted without, as it were, blindly reaching for shift values. A combination can be obtained, for example, by predefining limit values for the random numbers as a function of location. As described above, the constant magnetic field deviations may be greater in certain regions. Deviations also accumulate. The limit values for the random numbers are likewise higher there. Thus, each model can be combined with random numbers in order to keep the models more resilient to overlooked influences.

Advantageously, a maximum phase shift can be predefined for the measurement signals. The aim is to keep the phase shifts within a physically meaningful range. Although, when random numbers are used, limit values for the numbers are already specified as such, the resulting phase shift can however be provided with additional conditions. For example, it can be predetermined that in the case of two readout points next to one another on the k-space trajectory, the first recorded obtains a smaller phase shift. In this case too, the number of equalization coefficients used is limited to a minimum possible number.

In an exemplary embodiment, a plurality of partial datasets is provided as the first raw dataset, the partial datasets being recorded with at least one different measurement parameter consisting of the group of flip angle of the excitation pulse and/or repetition time. A particularly valuable application of the method described occurs in Magnetic Resonance Fingerprinting (MRF) for short, or MR fingerprinting. In MR fingerprinting, image datasets with different measurement parameters are acquired directly one after the other in order to generate signal progression curves which are influenced by a plurality of tissue and device parameters, for example, by the T1 relaxation time and/or the T2 relaxation time and/or the RF pulse strength B1 or the constant magnetic field B0.

Each signal progression curve is compared with the signal progression curves stored in a so-called dictionary and the tissue and device parameters are thus determined. Each signal progression curve is obtained from a multiplicity of MRF image datasets, usually a signal progression curve for each pixel.

In order to be able to record the multiplicity of MRF image datasets, namely in the order of several hundred, in a manageable time, the use of spiral trajectories when recording an MRF image dataset is known. In this case, an MRF image dataset may be subscanned forty-eight times. In order to reduce subscanning when generating a first raw dataset, a spiral k-space trajectory can be formed from a plurality of spirals. For this purpose, the spirals must have at least partially different readout points, otherwise there would only be an averaging. For example, the spirals can be twisted at an angle relative to one another. In the case of four spirals, there can be a 90° rotation in each case.

A spiral is therefore used to generate an MRF image dataset and a plurality of, for example four, spirals form a first raw dataset for generating an image dataset. As a result, the spirals can be used not only for an MRF method but at the same time for prior equalization.

Thus, an MRF raw dataset, that is to say the measurement signals on a spiral, which is used to reconstruct an MRF image dataset, represents a partial dataset of a first raw dataset.

When providing or recording the MRF image datasets, an additional task is therefore to obtain a correction for one or more first raw datasets which does not extend the measurement time, or at least not significantly.

To solve this problem, provision is therefore made to record one part with a spiral scan and one part with a Cartesian scan when recording the MRF image datasets. The method described at the beginning is to be supplemented to the effect that measurement parameters are varied during measurement.

In addition, the measurement sequence can also be varied, wherein the magnetization from measurement sequence to measurement sequence is assumed by direct succession of the measurement sequences during MR fingerprinting.

An MRF dataset recorded in this way then comprises a plurality of first raw datasets and at least one second raw dataset. Each of the first raw datasets may comprise a plurality of partial datasets. A plurality of MRF image datasets are then generated from it. However, the procedure for obtaining a corrected k-space trajectory is to be distinguished therefrom. In this case, a whole first raw dataset is used in spite of the different measurement parameters. In the entire first raw dataset, the phases are shifted by means of an equalization coefficient set and a single image dataset is generated therefrom—for each equalization coefficient set. Once the k-space trajectory has been found in which the similarity value is at its maximum, it can be used to reconstruct the plurality of MRF image datasets from the single k-space spiral trajectory.

Both the image datasets from the k-space spiral trajectory and the MRF image datasets from the spirals can be subscanned. However, the MRF image datasets are significantly more subscanned. Only by using the first raw datasets instead of the individual spirals is it possible to calculate meaningful similarity values. Equalization coefficient sets can be provided for any kind of k-space trajectory, but if the raw datasets are too significantly subscanned, this gives rise to the problem of the image datasets reconstructed therefrom having excessively convolutional artifacts. Then no meaningful similarity values can be created with a reference image dataset any longer.

In an exemplary embodiment, a plurality of first raw datasets is provided and an equalization coefficient set is selected for a first raw dataset, which is used for all first raw datasets or for partial datasets of the first raw datasets. This is also an application in MRF fingerprinting, in particular when using different measurement sequences with spiral scanning. The equalization coefficient set which results in the greatest similarity value is then determined for an image dataset. This can then be applied to other first raw datasets in order to correct them too.

In an exemplary embodiment, after the reconstruction of at least two image datasets from the first raw dataset using two different equalization coefficient sets, the resulting similarity values can be taken into account when generating a third equalization coefficient set. In other words, the generation of the equalization coefficient sets and of the image datasets can take place iteratively. On the basis of the image datasets, an assessment is made as to which equalization coefficient sets produce an improvement or which bring about a greater improvement and then efforts are made to further improve these. For example, a first equalization coefficient set can undertake phase shifts in the center of the k-space and a second can undertake phase shifts in the outer regions of the k-space. Depending on which of the image datasets generated from the first raw dataset using the first and the second equalization coefficient set has a greater similarity value, the equalization coefficient set assigned to the image dataset with the greater similarity value is modified.

In an exemplary embodiment, the first raw dataset can be recorded with a first measurement sequence and the measurement sequence for recording the second raw dataset can be selected in such a way that image datasets reconstructed from the first and the second raw dataset have structures that are as similar as possible. The gradient deviations bring about a change in the contours or structures in an image dataset reconstructed from a first raw dataset. The equalization coefficient set is intended to reverse this change. A comparison, for example, of the edges in an image dataset and in the reference image dataset then shows how well the equalization has worked. In particular, the first raw dataset and the second raw dataset can be recorded using the same measurement sequence, but different k-space trajectories.

Advantageously, an equalization coefficient set can also define a shift of the readout points of the measurement signals. Such a shift can be caused by gradient deviations. In particular, spiral trajectories are distorted in reality, for example, by gradient amplifier time shifts, eddy currents and accompanying gradient fields, also referred to as concomitant gradient fields. If the individual readout points are displaced, the k-space trajectory is always displaced as well. The readout point is then a further parameter which is present in the equalization coefficient set. As a result, equalization is somewhat more complex, but in the end even better.

The described concepts for generating the equalization coefficient set can also be used as a basis for the displacement of the readout points. Thus, in the generation of at least one equalization coefficient set, a model of the gradient deviation can be used when recording the first raw dataset. The displacement vectors can also be generated as a function of location and/or with random numbers.

In addition, the disclosure relates to a method for training an artificial neural network, comprising the steps:
  Receiving input training data, wherein the input training data is the first raw dataset as described in one or more embodiments,
  Receiving output training data, wherein the output training data is the second raw dataset as described in one or more embodiments,
  Training the neural network with the input and output training data, in particular by means of backpropagation,
  Providing the trained neural network.

A plurality of first raw datasets are produced in MRF. For each of these, an optimal equalization coefficient set can be determined for training the artificial neural network as described above. Then this data can also be used to train a neural network.

With the trained neural network, it is possible, instead of the permanent installation of raw datasets with a second k-space trajectory, in particular with a Cartesian scan, for generating reference image datasets, to use the latter only to train the artificial neural network and then to use MRF datasets again for which only k-space spiral trajectories were used in the scanning of the k-space.

The disclosure also relates to a method for generating at least one image dataset using a trained neural network as described, comprising the steps:
  Providing a first raw dataset, wherein the first raw dataset is recorded using a magnetic resonance system and comprises measurement signals at a plurality of readout points in the k-space, wherein the readout points lie on a first k-space trajectory,
  Applying the trained neural network as described to the first raw dataset, whereby a corrected first raw dataset is generated, and
  Reconstructing an image dataset from the corrected first raw dataset.

Once the neural network has been trained, it can be used to equalize the first raw datasets. Within the framework of MRF, a plurality of MRF image datasets can be reconstructed from a corrected or equalized first raw dataset as described.

Furthermore, the present disclosure relates to a computer program product which can be loaded into a memory of a programmable controller or a computer of a magnetic resonance system. With this computer program product, all or various previously described embodiments of the method according to the disclosure can be executed when the computer program product is running in the controller. The computer program product may require program resources, for example, libraries and auxiliary functions, in order to implement the corresponding embodiments of the method. In other words, the embodiments directed to the computer program product is intended in particular to protect software with which one of the embodiments of the method according to the disclosure described above can be executed or which executes this embodiment. In this case, the software can be a source code (e.g. C++) which has still to be compiled and linked or which only needs to be interpreted, or an executable software code which only remains to be loaded into the corresponding computer or controller for execution.

The disclosure also relates to a data carrier for a controller for controlling a computer, in particular a data generator of a magnetic resonance system and/or an evaluator, with data for carrying out the described method. Advantageously, the data generator can be an image generator. The evaluator can be a component of the magnetic resonance system or can be an external unit. Then the data carrier can also be a permanently accessible memory of the magnetic resonance system. It does not have to be installed in the controller of the magnetic resonance system for this purpose, it can also be designed as a storage service or a cloud server.

The aforementioned methods can be implemented in the control apparatus as software or else as (hard-wired) hardware.

The disclosure also relates to a magnetic resonance system with a controller. The magnetic resonance system is characterized in that the controller is designed to carry out the method as described.

Further advantageous embodiments of the magnetic resonance system according to the disclosure correspond to corresponding embodiments of the method according to the disclosure. In order to avoid unnecessary repetition, reference is thus made to the corresponding method features and their advantages.

FIG. 1 shows a magnetic resonance (MR) system 1 according to an exemplary embodiment that includes a scanner 2 and a controller 3. The scanner 2 has three gradient coils 4, 5 and 6 for generating gradient fields. Furthermore, a transmitter coil arrangement 7 is present on the scanner 2. The transmitter coil arrangement 7 can be designed as a whole-body coil. However, the transmitter coil arrangement 7 can also be a transmitter coil array. In an exemplary embodiment, the controller 3 includes processor circuitry 100 that is configured to perform one or more functions and/or operations of the controller 3. For example, the processor circuitry 100 may be configured to execute one or more executable instructions (e.g. of the computer program product 10) to perform one or more functions and/or operations of the controller 3 (e.g. perform the method according to one or more aspects of the disclosure). The processor circuitry 100 may also be configured to control the overall operation of the MR system 1.

The transmitter coil arrangement 7 can also be used for signal reception. However, it is also known to use local coils to increase the signal-to-noise ratio SNR. In particular, a coil array can be used as the receiving coil arrangement 8 for performing parallel imaging. The measurement time can be reduced with a coil array.

The controller 3 of the magnetic resonance system 1 has a data carrier (memory) 9 on which a computer program product 10 for carrying out the method described is stored. An FISP measurement sequence 11 with spiral k-space scanning, a FLASH measurement sequence 12 with spiral k-space scanning, a TrueFISP measurement sequence 13 with spiral k-space scanning and an FISP measurement sequence 14 with Cartesian k-space scanning of unconnected rows can also be stored on the data carrier 9.

Furthermore, an EPI measurement sequence 15 with Cartesian k-space scanning and a FLASH measurement sequence 16 with Cartesian k-space scanning can also be stored.

The FISP measurement sequence 11 can be used to record a first raw dataset 17. A first raw dataset 18 can be acquired with the FLASH measurement sequence 12. The TrueFISP measurement sequence 13 can be used to acquire a first raw dataset 19. A second raw dataset 20, on the other hand, can be obtained with the FISP measurement sequence 14.

Likewise, a first raw dataset 21 can be obtained with the EPI measurement sequence 15 and a second raw dataset 22 with the FLASH measurement sequence 16.

Further conventional components of the magnetic resonance system 1, such as a patient couch, etc. are not shown for the sake of clarity.

FIG. 2 shows a TrueFISP sequence diagram 23 for the TrueFISP measurement sequence 13. The gradient axes are labeled as usual with $G_R$ for the reading direction, $G_P$ for the phase encoding direction and $G_S$ for the layer selection direction. ACQ denotes the axis for the radio-frequency pulses and acquisition windows.

In order to excite only one layer with the radio-frequency pulse 24, a layer selection gradient 25 is applied simultaneously to the radio-frequency pulse 24 in the layer selection direction $G_S$. In order to compensate for its dephasing effect on magnetization in the transverse plane, a layer re-phasing gradient 26 directly follows the layer selection gradient 25. In addition to these gradients, a layer dephasing gradient 27 is present in the layer selection direction $G_S$. This ensures that the TrueFISP measurement sequence 13 is balanced over a repetition time $T_R$. I.e. the sums of the gradient moments in the layer selection direction GS are equal to zero over a repetition time $T_R$.

A phase encoding gradient 28 is used in the phase encoding direction $G_P$. The latter, like the reading gradient 29, is applied in an oscillating manner in the reading direction $G_R$. In the case of non-Cartesian trajectories, we usually no longer speak of Gp and GR, but of Gx and Gy. This embodiment is used to scan the k-space spirally.

In order to balance the gradient moments, a read-rewind gradient 30 and a phase-rewind gradient 31 are found at the end of the gradients applied in an oscillating manner. These are shown as dashed lines for better demarcation of the read gradient 29 and the phase encoding gradient 28. The TrueFISP measurement sequence 13 is thus fully balanced over a repetition time $T_R$, i.e. the sums of the gradient moments in all directions are equal to zero over a repetition time $T_R$.

The measurement signals 32 are recorded in the acquisition phase.

The recording of a further raw dataset is started with the radio-frequency pulse 33. This has a different flip angle to the previous radio-frequency pulse 24. Possible variations of the flip angles are shown in FIG. 6.

In an FISP measurement sequence 11, at least the layer dephasing gradient 27, possibly also the read rewind gradient 30, is omitted compared to the TrueFISP measurement sequence 13. An FISP measurement sequence 11 is therefore only balanced in the phase direction $G_P$ and possibly in the reading direction $G_R$, but not in the layer selection direction $G_S$.

In contrast to a TrueFISP sequence 13, a FLASH measurement sequence 12 is not balanced in any direction. Accordingly, the layer dephasing gradient 27, the read rewind gradient 30 and the phase rewind gradient 31 are missing.

Due to the otherwise great similarities, only a TrueFISP sequence diagram 23 has been shown, the modifications for an FISP measurement sequence 11 and a FLASH measurement sequence 12 result as described.

FIG. 3 shows a k-space 34 with a spiral k-space trajectory 35 associated with the measurement sequences 11 to 13 with the spirals 35a, 35b, 35c and 35d. The four spirals 35a, 35b, 35c and 35d are the same shape but are rotated in 90° steps with respect to one another. This results in a denser scanning of the k-space 34 in the center.

By way of example, some readout points 36 are provided with reference characters at which measurement signals 32 are recorded. This is a known pictorial representation of the position encoding of the measurement signals 32.

A phase 37a, 37b, 37c and 37d of the phase distribution 37 of the k-space trajectory 35 in the known clock hand representation is plotted by way of example at four readout points 36. A phase exists at each readout point, even if only some have been displayed. Each readout point 36 has its own phase.

The use of a plurality of spirals 35a, 35b, 35c and 35d as a spiral k-space trajectory 35 is a possible embodiment of a spiral trajectory.

FIG. 4 shows a k-space 34 with a k-space trajectory 38 associated with the measurement sequences 14 or 16 with k-space rows 39a to 39l. The readout points 40 are on the k-space rows 39a to 39l here. The k-space trajectory 38 consists of individual, unconnected k-space rows 39a to 39l. The arrowheads at the ends of the k-space rows are intended to represent the equality of the readout direction, but otherwise have no significance.

The phases 41a to 41l of the k-space rows 39a to 39l are again represented by a clock hand representation. The readout points 40 of a k-space row always have the same phase.

FIG. 5 shows a k-space 34 with a k-space trajectory 42 associated with the EPI measurement sequence 15 with k-space rows 43a to 43l. The readout points 44 are on the k-space rows 43a to 43l here. The k-space trajectory 42 consists of connected k-space rows 43a to 43f and 43g to 43l, which are arranged in two blocks 45 and 46. In other words, measurement is segmented. As described above, the blocks 45 and 46 usually have more than two k-space rows. Only a few k-space rows are shown for the sake of clarity.

In FIG. 5 too, the phases 47a to 47l of the k-space rows 43a to 43l are represented by a clock hand display. The readout points 44 of a k-space row always have the same phase.

As already described several times, a k-space trajectory, that is to say also the k-space trajectory 42, comprises all the measurement signals 32, here represented by readout points 44, which are used in the generation of an image dataset. It thus contains both blocks 45 and 46 and not only one of the two.

FIG. 6 shows a diagrammatic view of a recording method for recording an MRF dataset. The number of the recorded MRF image dataset is plotted on the axis 48 and different variables on the axis 49. The first variable is the flip angle in ° from 0° at the origin to 90° at the axis point 50. The axis 48 runs from the MRF image dataset 1 to the MRF image dataset 3000.

The 3000 MRF image datasets are divided into eleven sections 51, 52, 53, 54, 55, 56, 57, 58, 59 and 60.

In the first section 51, the flip angle of the FISP measurement sequence 12, which was used in the recording, is plotted over the curve 62 for two hundred MRF image datasets. As described in relation to FIG. 2, after the application of a radio-frequency pulse with a certain flip angle, a complete spiral is recorded and then the next radio-frequency pulse is applied with the next flip angle and a further spiral rotated by 90° is scanned. FIG. 6 shows, in section 51, a flip angle distribution corresponding to a $\sin^2$ curve. The maximum flip angle is 24° and constant phases are used.

For the hundredth MRF image dataset, a line 63 is entered purely by way of example. The corresponding flip angle is the maximum flip angle of the curve 62.

In the second section 52, four hundred MRF image datasets are acquired with the TrueFISP sequence 13 according to FIG. 2. Flip angles are used according to the curves 64 and 65. In the case of the curve 64, these range up to 45° and in the case of the curve 65, to 72°.

A line 66 is also plotted purely by way of example in the case of the four-hundredth MRF image dataset for the section 52. Here, the flip angle is 1°.

A special feature is the use of two different phase cycles in section 52. When passing through the flip angles of the curve 64, a phase cycle is not used and, when passing through the curve 65, a 180° phase cycle. A phase cycle refers to the excitation phase of the radio-frequency pulse and is distinct from the phase of the magnetic resonance signals.

In the following section 53, the flip angles for recording four hundred and fifty MRF image datasets with a FLASH measurement sequence 12 are indicated in the curve 67. These are smaller than in the FISP or TrueFISP measurement sequence and are up to 6°. Their distribution is also a $\sin^2$ distribution.

In addition to the variation of the flip angles, a phase cycle for implementing an RF spoiling is applied during the repeated passage of the FLASH sequence. The excitation phase of the radio-frequency pulse is increased by multiples of 117°.

The sequence of the measurement sequences 11, 12 and 13 together form a block 61. This is used three times in total in FIG. 6. The focus is solely on the type of measurement sequence but not on the number of MRF image datasets or the flip angle curves.

In section 54, 200 MRF image datasets are again recorded with an FISP sequence 11. The phase is constant as in section 51, but the maximum flip angle is 45°. These are on the curve 68.

In section 55, 200 MRF image datasets which are to be acquired with a TrueFISP measurement sequence 13 follow. A 90° phase cycle is used here, the maximum flip angle is 50°. The flip angles are plotted on the curve 69.

The next approximately 450 MRF image datasets in section 56 are to be recorded with a FLASH measurement sequence 12, as in section 53. The curve 70 shows a $\sin^2$ distribution with a maximum value of 14°.

The curve 71 in section 57 runs to 72° and shows the flip angles of the radio-frequency pulse 24 or 33 when an FISP measurement sequence 11 is used for the third time. The excitation phase is also constant in this iteration.

When acquiring another two hundred MFR image datasets in section 58 with a TrueFISP measurement sequence 13 according to FIG. 2, a 270° phase cycle is used. The flip angles which are plotted in the curve 72 run to 65°.

The next approximately 450 MRF image datasets in section 59 are recorded with the FLASH measurement sequence 16. The curve 73 represents a flip angle profile of up to a maximum of 20°, in turn $\sin^2$-distributed.

Up to this section, measurement sequences with spiral trajectories were always used for scanning the k-space. The acquired raw datasets are first raw datasets. The measurement signals scanned on spirals of four successive MRF image datasets in each case are combined into a first raw dataset. The number of first raw datasets is thus a quarter of the number of MRF image datasets.

A Cartesian scan is used hereinafter, as shown in FIG. 4.

In the last section 60 there are two curves 74 and 75 for recording second raw datasets with an FISP measurement sequence 14. These in turn represent flip angle profiles. As in the previous sections, a constant excitation phase of the radio-frequency pulse is used in the FISP measurement sequence 18. A plurality of k-space rows which are used to generate an MRF image dataset can be recorded with the same flip angle. As with the first raw dataset, a second raw dataset then comprises a certain multiple of the plurality of k-space rows. For example, four k-space rows can be used to reconstruct an MRF image dataset and sixteen, that is to say four times four, to reconstruct a reference image dataset. Accordingly, the k-space trajectory of the second raw dataset comprises sixteen unconnected k-space rows.

The section with the Cartesian scanned second raw datasets forms a block 76.

In summary, it can be stated that, irrespective of the specific number of images and the respective maximum flip angles, a $\sin^2$-distributed flip angle curve is preferably used in all sections. Considerably fewer image datasets can also be recorded in one section, but preferably at least 10.

The first and second raw datasets recorded in this way together form one MRF dataset.

It is true that there need only be a single second raw dataset for carrying out the method. In this example, a plurality of second raw datasets are acquired to scan the curves 74 and 75. The second raw datasets can then also be used to generate a plurality of MRF image datasets in each case.

FIG. 7 shows a corrected first raw dataset 77 with a corrected phase distribution 78 and a corrected k-space trajectory 79. In this case, an equalization coefficient set 80 has been applied to a first raw dataset. By way of example, the displacement vectors 80a to 80d are provided with reference characters from the equalization coefficient set 80. As a result, the phases 37a to 37d are shifted to corrected phases 78a to 78d and the readout points 36 to corrected readout points 81.

Each displacement vector 80a to 80d causes a phase shift of the phases 37a to 37c and/or a local shift of the readout points 36 in the k-space 34, both shifts being shown in FIG. 7. However, it can also be designed as an identity shift. It then changes nothing. Both the readout point and the phase are parameters of a single measurement signal, for which reason the equalization of these parameters can also be combined in each case in a single displacement vector 80a to 80d.

The effect of an equalization coefficient set 80 is shown by way of example for four spirals 79a to 79d of a spiral k-space trajectory 79. Thus, in the case of a spiral scan, not only one spiral can be used, but also a plurality of spirals which are offset or rotated with respect to one other. Corresponding displacement vectors and equalization coefficient sets 80 can of course be used for any k-space trajectories.

FIG. 8 shows a first embodiment for the reconstruction of image datasets. On the basis of a first raw dataset 17, corrected first raw datasets 77, 85, 86 and 87 are generated by applying equalization coefficient sets 80, 82, 83 and 84. An image dataset 88, 89, 90 and 91 is generated from each corrected first raw dataset 77, 85, 86 and 87.

A reference image dataset 92 is generated from the second raw dataset 20 without changes.

The image datasets 88, 89, 90 and 91 are compared with the reference image dataset 92 and in each case a similarity value $\alpha_{88}$, $\alpha_{89}$, $\alpha_{90}$ and $\alpha_{91}$ is determined. The image dataset with the greatest similarity value is selected.

If this is the image dataset 91, for example, and if this is part of an MRF dataset, MRF image datasets 91a, 91b, 91c and 91d are generated from individual spirals 79a to 79d of the k-space trajectory 79 of the image dataset 91.

In connection with MR fingerprinting, the reference image dataset 92 can also be recorded with varying measurement parameters during the acquisition of the k-space rows. Then MRF image datasets 92a, 92b, 92c and 92d can also be generated from the reference image dataset 92. For each of the pixels, a signal progression curve is created from the MRF image datasets 91a, 91b, 91c, 91d, 92a, 92b, 92c and 92d and compared with a dictionary. In this way, values for, for example T1, T2, B0 and B1, are obtained for each pixel.

In this case, the MRF image datasets 91a, 91b, 91c and 91d are subscanned four times compared to the image dataset 91 and the MRF image datasets 92a, 92b, 92c and 92d are subscanned four times compared to the reference image dataset 92. This is possible, however, as the MRF image datasets 91a, 91b, 91c, 91d, 92a, 92b, 92c and 92d are used as described to create signal progression curves and not for direct inspection.

FIG. 9 shows a flow chart of a second embodiment for generating an image dataset.

In step S1, a first raw dataset 17 and a second raw dataset 20 are provided. The first raw dataset 17 is recorded with a spiral scan and the second raw dataset 20 with a Cartesian scan.

In step S2, the k-space trajectory of the first raw dataset 17 is shifted using a first equalization coefficient set 80 and generated from the corrected k-space trajectory 79 by re-gridding a Cartesian intermediate dataset. This intermediate dataset is reconstructed by means of a Fourier transform to form a first image dataset 88.

Re-gridding and Fourier transform are reconstruction steps customary in the reconstruction of raw datasets with spiral trajectories.

Thereafter, in step S3, a second image dataset 89 is reconstructed from the same first raw dataset 17 using a second equalization coefficient set.

In the following step S4, a reference image dataset 91 is reconstructed from the second raw dataset 20. Then, in step S5, similarity measures $\alpha_{88}$ and $\alpha_{89}$ are determined. The equalization coefficient set associated with the image dataset with the greater similarity measure is used as a starting point for determining a third equalization coefficient set 83. If the first equalization coefficient set 80 were the one with the image dataset with the greater similarity measure, for example, then the displacement vectors of the first equalization coefficient set 80 can obtain a positive "entry" and those of the second equalization coefficient set 82 a negative one.

In step S6, a third image dataset 90 is reconstructed from the aforementioned first raw dataset 17 using the third equalization coefficient set 83 and a similarity measure $\alpha_{90}$ to the reference image dataset 92 is determined. Depending on whether the similarity measure $\alpha_{90}$ is greater or smaller than the previous best similarity measure, the third equalization coefficient set 83 or the first equalization coefficient set 80 will continue to be used.

Of course, more than two equalization coefficient sets can be used at the outset to establish a starting point. In particular, the initial equalization coefficient sets can fulfill predetermined specifications, e.g. only shift in the center or only in the outer region.

Based on this iterative adjustment of the equalization coefficient sets, the method can be continued until a termination criterion is fulfilled. This can be a maximum iteration step or the attainment of a predetermined similarity measure.

The method can then conclude with only a first raw dataset present.

However, if a multiplicity of first raw datasets are present, as shown in FIG. 6, the equalization coefficient set associated with the image dataset having the greatest similarity measure can be stored in step S7. This is used to also equalize the other first raw datasets and to reconstruct MRF image datasets therefrom.

In this case, a raw dataset which has been recorded with the same measurement sequence as the second raw dataset is used as the first raw dataset 17. In the example of FIG. 6, this was the FISP measurement sequence.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generating at least one image dataset and one reference image dataset of an examination object from at least two raw datasets, the method comprising:
providing a first raw dataset that is recorded using a magnetic resonance system, the first raw dataset including measurement signals at a plurality of readout points in k-space, wherein the readout points lie on a first k-space trajectory;
providing a second raw dataset that is recorded using the same magnetic resonance system and on the same examination object as the first raw dataset, the second raw dataset including measurement signals at a plurality of readout points in k-space, wherein the readout points lie on a second k-space trajectory different from the first k-space trajectory;
reconstructing a plurality of image datasets from the first raw dataset, wherein a separate equalization coefficient set is used before reconstruction of each image dataset of the plurality of image datasets, wherein each of the corresponding equalization coefficient sets defines a phase shift of the phases of the measurement signals of the first raw dataset in k-space;
reconstructing a reference image dataset from the second raw dataset;
comparing the reference image data set with each image dataset of the plurality of image datasets to generate respective similarity values; and
selecting the image dataset with a greatest similarity value of the respective similarity values.

2. The method as claimed in claim 1, wherein a spiral trajectory is used as the first k-space trajectory, in which a scanning of at least part of the k-space takes place with a reading gradient which varies over time.

3. The method as claimed in claim 1, wherein a Cartesian distribution of the plurality of readout points is used as the second k-space trajectory.

4. The method as claimed in claim 2, wherein a Cartesian distribution of the plurality of readout points is used as the second k-space trajectory.

5. The method as claimed in claim 1, wherein a model of a magnetic field deviation during the recording of the first raw dataset is used in generation of at least one of the equalization coefficient sets.

6. The method as claimed claim 1, wherein at least one of the equalization coefficient sets is generated with random numbers.

7. The method as claimed in claim 1, wherein a maximum phase shift is specified for the measurement signals.

8. The method as claimed in claim 1, wherein a plurality of partial datasets is provided as the first raw dataset, the plurality of partial datasets being recorded with at least one different measurement parameter including: flip angle of an excitation pulse and/or repetition time.

9. The method as claimed in claim 1, wherein a plurality of first raw datasets are provided, and one of the equalization coefficient sets is selected for a first raw dataset, of the plurality of first raw datasets, which is used for all first raw datasets of the plurality of first raw datasets.

10. The method as claimed in claim 1, wherein after the reconstruction of at least two image datasets, of the plurality of image datasets, from the first raw dataset, using two different equalization coefficient sets, resulting similarity values are considered in generating a third equalization coefficient set.

11. The method as claimed in claim 1, wherein the first raw dataset is recorded using a first measurement sequence and the measurement sequence for recording the second raw dataset is selected such that image datasets reconstructed from the first and the second raw datasets have a same contrast.

12. The method as claimed in claim 1, wherein an equalization coefficient set additionally defines a shift of the plurality of readout points of the measurement signals.

13. A non-transitory computer-readable storage medium with an executable program stored thereon, that when executed, instructs a controller of the magnetic resonance system to perform the method of claim 1.

14. A computer program product, embodied on a non-transitory computer-readable storage medium, having a program and being directly loadable into a memory of the magnetic resonance system, when executed by an image generator of the magnetic resonance system, causes the image generator to perform the method as claimed in claim 1.

15. A method for training an artificial neural network and generating at least one image dataset using the trained artificial neural network, comprising:

receiving input training data that is recorded using a magnetic resonance system, the input training data being a first raw dataset including measurement signals at a plurality of readout points in k-space, wherein the readout points lie on a first k-space trajectory;

receiving output training data that is recorded using the same magnetic resonance system and on the same examination object as the first raw dataset, the output training data being a second raw dataset including measurement signals at a plurality of readout points in k-space, wherein the readout points lie on a second k-space trajectory different from the first k-space trajectory;

training the artificial neural network with the input and output training data using back propagation;

applying the trained artificial neural network to the first raw dataset to generate a corrected first raw dataset; and reconstructing an image dataset from the corrected first raw dataset.

16. A method for generating at least one image dataset using a trained neural network, the method comprising:

providing a first raw dataset that is recorded using a magnetic resonance system, the first raw dataset including measurement signals at a plurality of readout points in k-space, wherein the plurality of readout points lie on a first k-space trajectory;

applying the trained neural network to the first raw dataset to generate a corrected first raw dataset, the trained neural network being trained using back propagation and based on the first raw dataset as input training data and a second raw data set as output training data, wherein the second raw data set is acquired with the same magnetic resonance system and at a same examination object as the first raw data set, the second raw data set including measurement signals at a plurality of read-out points that lie on a second k-space trajectory that is different from the first k-space trajectory; and reconstructing an image dataset from the corrected first raw dataset.

\* \* \* \* \*